(12) United States Patent
Azimi et al.

(10) Patent No.: US 7,062,133 B2
(45) Date of Patent: Jun. 13, 2006

(54) METHODS AND APPARATUS FOR ALIGNMENT AND ASSEMBLY OF OPTOELECTRONIC COMPONENTS

(75) Inventors: Masud Azimi, Belmont, MA (US); Andrew Vote, Arlington, MA (US); Daryoosh Vakhshoori, Cambridge, MA (US)

(73) Assignee: Ahura Corporation, Wilmington, MA (US)

( * ) Notice: Subject to any disclaimer, the term of this patent is extended or adjusted under 35 U.S.C. 154(b) by 0 days.

(21) Appl. No.: 10/832,059

(22) Filed: Apr. 26, 2004

(65) Prior Publication Data

US 2005/0002615 A1    Jan. 6, 2005

Related U.S. Application Data

(60) Provisional application No. 60/465,144, filed on Apr. 24, 2003.

(51) Int. Cl.
*G02B 6/32* (2006.01)
*G02B 6/42* (2006.01)

(52) U.S. Cl. .......................................... 385/52; 385/33

(58) Field of Classification Search .................. 385/33, 385/52, 72
See application file for complete search history.

(56) References Cited

U.S. PATENT DOCUMENTS 6,179,483 B1 *  1/2001  Kanazawa ................... 385/93
6,512,642 B1 *  1/2003  Bourcier et al. ............ 359/813
6,690,865 B1 *  2/2004  Miyazaki ..................... 385/52
6,839,493 B1 *  1/2005  Berto .......................... 385/52
6,847,766 B1 *  1/2005  Kim et al. .................... 385/52

* cited by examiner

Primary Examiner—Sung Pak
Assistant Examiner—Tina M. Wong
(74) Attorney, Agent, or Firm—Pandiscio & Pandiscio

(57) ABSTRACT

Apparatus is disclosed for precision alignment and assembly of opto-electronic components relative to one another, the apparatus comprising a selected optical component having a periphery forming at least one flat surface; a holding block having at least one attachment region corresponding to the at least one flat surface of the selected optical component; a positioning mechanism having a first portion and a second portion, the first portion configured to position the selected optical component relative to another opto-electronic component, and the second portion configured to position the holding block relative to the selected optical component and in contact with a platform in attachment with the another opto-electronic component; and an attachment component disposed between the selected optical component and the holding block, and the attachment component disposed between the holding block and the platform so as to fix the selected optical component in position relative to the another opto-electronic component. A method of precision alignment and assembly of opto-electronic components relative to one another is disclosed, the method comprising: positioning the selected optical component relative to the another optical component using the first portion of the positioning mechanism; positioning the holding block relative to the selected optical component and in contact with the platform; and securing the selected optical component and the holding block, and the holding block and the platform, with the attachment component.

5 Claims, 9 Drawing Sheets

METHODS AND APPARATUS FOR ALIGNMENT AND ASSEMBLY OF OPTOELECTRONIC COMPONENTS

REFERENCE TO PENDING PRIOR PATENT APPLICATION

This patent application claims benefit of pending prior U.S. Provisional Patent Application Ser. No. 60/465,144, filed Apr. 24, 2003 by Masud Azimi et al. for ATTACHMENT CONFIGURATIONS FOR OPTOELECTRONIC COMPONENTS AND ASSEMBLIES (Attorney's Docket No. AHURA-12 PROV), which patent application is hereby incorporated herein by reference.

FIELD OF THE INVENTION

This invention related to methods and apparatus for the alignment and assembly of optoelectronic components in general, and more particularly to methods and apparatus for precision alignment and assembly of optoelectronic components without a correction process subsequent to attachment of the opto-electronic components.

BACKGROUND OF THE INVENTION

In order to facilitate large volume production of sophisticated opto-electronic assemblies, it is important to develop high productivity apparatus and methods for manufacturing precision opto-electronic assemblies. This includes avoiding the need to reposition opto-electronic components subsequent to attachment to a common platform or the use of any other post-attachment correction process.

The basic building blocks of sophisticated opto-electronic assemblies include optical components such as optical lenses, optical fibers, optical filters, optical beam splitters, optical reflectors, and wavelength selective elements, which need to be precisely positioned with respect to each other and then attached to a common platform. The alignment and attachment of these optical elements should maintain the relative position of these elements with respect to each other and to other components on the common platform at micrometer to sub-micrometer accuracy over life of the device. The development of high productivity methods and apparatus for manufacturing precision opto-electronic assemblies should also include attachment techniques which have three dimensional (3-D) freedom of movement on a common platform with micrometer to sub-micrometer accuracy for free space optical connectivity during alignment and prior to fixation of the optical elements. This should also include attachment techniques as one time alignment-attachment processes which do not require further correction or fine realignment of an optical component after attachment as opposed to the common practice at present time of implementing a post attachment correction process. These methods and apparatus should also be low cost, easy to implement, and useful for large volume manufacturing and prototype fabrication.

SUMMARY OF THE INVENTION

An object of the invention is to provide a method for alignment and assembly of optoelectronic components.

Another object of the invention is to provide a method for alignment and assembly of optoelectronic compounds without a post-attachment correction process.

A further object of the invention is to provide apparatus for precision alignment and assembly of optoelectronic components.

A still further object is to provide apparatus for alignment and assembly of optoelectronic components without a correction process subsequent to attachment of the opto-electronic components.

With the above and other objects in view, as will hereinafter appear, there is provided apparatus for precision alignment and assembly of opto-electronic components relative to one another, the apparatus comprising:

a selected optical component having a periphery forming at least one flat surface;

a holding block having at least one attachment region corresponding to the at least one flat surface of the selected optical component;

a positioning mechanism having a first portion and a second portion, the first portion configured to position the selected optical component relative to another opto-electronic component, and the second portion configured to position the holding block relative to the selected optical component and in contact with a platform in attachment with the another opto-electronic component; and an attachment component disposed between the selected optical component and the holding block, and the attachment component disposed between the holding block and the platform so as to fix the selected optical component in position relative to the another opto-electronic component.

In accordance with a further feature of the invention there is provided apparatus for precision alignment and assembly of opto-electronic components relative to one another, the apparatus comprising:

a selected optical component having a periphery forming at least one flat surface;

a holding block having at least one attachment region corresponding to the at least one flat surface of the selected optical component;

a positioning mechanism having a flexible finger mechanism and a pressing mechanism, the flexible finger portion configured to position the selected optical component relative to another opto-electronic component, and the pressing mechanism configured to position the holding block relative to the selected optical component and in contact with a platform in attachment with the another opto-electronic component; and an attachment component disposed between the selected optical component and the holding block, and the attachment component disposed between the holding block and the platform so as to fix the selected optical component in position relative to the another opto-electronic component;

wherein the at least one attachment region of the holding block is substantially vertical so as to permit vertical adjustment of the selected optical component with respect to the platform;

wherein the holding block comprises a substantially horizontal attachment region configured to permit horizontal adjustment of the selected optical component with respect to the platform prior to fixation of the holding block to the platform; and wherein the positioning mechanism comprises a main body configured for attachment to an XYZ motion system, a gripper arm having a first end and a second end, the first end of the gripper arm connected to a flexure to the main body, the second end of the gripper arm connected to the flexible finger mechanism, and the pressing mechanism comprises a sliding rail system and a spring, a first portion of the sliding rail system mounted vertically to the main body, a second portion of the sliding rail system mounted vertically to the pressing mechanism, and ball bearings between the first portion and the second portion to allow vertical motion, and restrict horizontal motion, of the pressing mechanism with respect to the main body, and the spring extending between the main body and the pressing mechanism to compress the holding block disposed between the platform and the pressing mechanism.

In accordance with a further feature of the invention there is provided apparatus for precision alignment and assembly of opto-electronic components relative to one another, the apparatus comprising:

a selected optical component having a periphery forming at least one flat surface;

a holding block having at least one attachment region corresponding to the at least one flat surface of the selected optical component;

a positioning mechanism having a first portion and a second portion, the first portion configured to position the selected optical component relative to another opto-electronic component, and the second portion configured to position the holding block relative to the selected optical component and in contact with a laser submount in attachment with the another opto-electronic component; and an attachment component disposed between the selected optical component and the holding block, and the attachment component disposed between the holding block and the laser submount so as to fix the selected optical component in position relative to the another opto-electronic component;

wherein the holding block comprises a substantially vertical attachment region configured to permit vertical adjustment of the holding block along the laser submount prior to fixation of the selected optical component thereon;

wherein the at least one attachment region of the holding block is substantially horizontal so as to permit attachment to a substantially horizontally disposed portion of the at least one flat surface of the selected optical component; and wherein the first portion of the positioning mechanism comprises a parallel gripper having a first end and a second end, the first end configured for releasably securing the selected optical component and the second end configured for attachment to an XYZ motion system, and the second portion of the positioning mechanism comprises a holding elevator configured for selectively positioning the holding block in a vertical direction while maintaining contact with the laser submount as contact is made between the at least one attachment region of the holding block and the at least one flat surface of the selected optical component.

In accordance with a still further feature of the invention there is provided apparatus for precision alignment and assembly of opto-electronic components relative to one another, the apparatus comprising:

a selected optical component having a periphery forming at least two flat surfaces;

a first holding block having at least one attachment region corresponding to a first one of the at least two flat surfaces of the selected optical component, and a second holding block having at least one attachment region corresponding to a second one of the at least two flat surfaces of the selected optical component;

a positioning mechanism having a first portion and a second portion, the first portion configured to position the selected optical component relative to another opto-electronic component, and the second portion configured to position the first holding block and the second holding block relative to the selected optical component and in contact with a platform in attachment with the another opto-electronic component; and an attachment component disposed between the selected optical component and the holding block, and the attachment component disposed between the holding block and the platform so as to fix the selected optical component in position relative to the another optical component;

wherein the second one of the at least two flat surfaces of the selected optical component is disposed in opposition to the first one so as to permit positioning of the holding block and the second holding block in parallel with one another; and wherein the first portion of the positioning mechanism comprises a pair of gripper arms having a first end and a second end, respectively, the first end configured for releasably securing the selected optical component and the second end configured for attachment to an XYZ motion system, and the second potion of the positioning mechanism comprises a pair of push rods selectively extending from the pair of gripper arms, respectively, further wherein the gripper arms and the XYZ motion system are configured to align the selected optical component with the another opto-electronic component, and the push rods are configured to push the first holding block and the second holding block against the platform, respectively.

In accordance with another further feature of the invention there is provided apparatus for precision alignment and assembly of opto-electronic components relative to one another, the apparatus comprising:

a selected optical component having a periphery forming at least one flat surface;

a holding block having at least one attachment region corresponding to the at least one flat surface of the selected optical component;

a positioning mechanism having a first portion and a second portion, the first portion configured to position the selected optical component relative to another opto-electronic component, and the second portion configured to position the holding block relative to the selected optical component and in contact with a platform in attachment with the another opto-electronic component; and an attachment component disposed between the selected optical component and the holding block, and disposed between the holding block and the platform so as to fix the selected optical component in position relative to the another opto-electronic component;

wherein the holding block has a top surface and a bottom surface, and the top surface and the bottom surface are configured at a non-parallel angle with respect to one another;

wherein the at least one flat surface of the optical component is disposed at the non-parallel angle of the holding block when positioned by the first portion of the positioning mechanism so as to mate with the top surface of the holding block when the holding block is wedged between the platform; and wherein the first portion of the positioning mechanism comprises a first pair of gripping mechanisms having a first end and a second end, the first end configured for releasably securing the selected optical component and the second end configured for attachment to an XYZ motion system, and the second portion of the positioning mechanism comprises a second pair of gripping mechanisms configured to slide the holding block over the platform to the selected optical component so as to wedge the holding block between the platform and the selected optical component.

In accordance with a still another further feature of the invention there is provided apparatus for precision alignment and assembly of opto-electronic components relative to one another, the apparatus comprising:

a selected optical component having a periphery forming at least one flat surface;

a holding block having at least one attachment region corresponding to the at least one flat surface of the selected optical component; and an attachment component disposed between the selected optical component and the holding block, and the attachment component disposed between the holding block and the platform so as to fix the selected optical component in position relative to another opto-electronic component.

In accordance with a yet still another further feature of the invention there is provided a method of precision alignment and assembly of opto-electronic components relative to one another, the method comprising:

providing apparatus for precision alignment and assembly of opto-electronic components relative to one another, the apparatus comprising:

a selected optical component having a periphery forming at least one flat surface;

a holding block having at least one attachment region corresponding to the at least one flat surface of the selected optical component;

a positioning mechanism having a first portion and a second portion, the first portion configured to position the selected optical component relative to another opto-electronic component, and the second portion configured to position the holding block relative to the selected optical component and in contact with a platform in attachment with the another opto-electronic component; and an attachment component disposed between the selected optical component and the holding block, and the attachment component disposed between the holding block and the platform so as to fix the selected optical component in position relative to the another opto-electronic component;

positioning the selected optical component relative to the another optical component using the first portion of the positioning mechanism;

positioning the holding block relative to the selected optical component and in contact with the platform; and securing the selected optical component and the holding block, and the holding block and the platform, with the attachment component.

In accordance with another further feature of the invention there is provided a method of precision alignment and assembly of opto-electronic components relative to one another, the method comprising:

providing apparatus for precision alignment and assembly of opto-electronic components relative to one another, the apparatus comprising:

a selected optical component having a periphery forming at least one flat surface;

a holding block having at least one attachment region corresponding to the at least one flat surface of the selected optical component;

a positioning mechanism having a flexible finger mechanism and a pressing mechanism, the flexible finger portion configured to position the selected optical component relative to another opto-electronic component, and the pressing mechanism configured to position the holding block relative to the selected optical component and in contact with a platform in attachment with the another opto-electronic component; and an attachment component disposed between the selected optical component and the holding block, and the attachment component disposed between the holding block and the platform so as to fix the selected optical component in position relative to the another opto-electronic component;

wherein the at least one attachment region of the holding block is substantially vertical so as to permit vertical adjustment of the selected optical component with respect to the platform;

wherein the holding block comprises a substantially horizontal attachment region configured to permit horizontal adjustment of the selected optical component with respect to the platform prior to fixation of the holding block to the platform; and wherein the positioning mechanism comprises a main body configured for attachment to an XYZ motion system, a gripper arm having a first end and a second end, the first end of the gripper arm connected to a flexture to the main body, the second end of the gripper arm connected to the flexible finger mechanism, and the pressing mechanism comprises a sliding rail system and a spring, a first portion of the sliding rail system mounted vertically to the main body, a second portion of the sliding rail system mounted vertically to the pressing mechanism, and ball bearings between the first portion and the second portion to allow vertical motion, and restrict horizontal motion, of the pressing mechanism with respect to the main body, and the spring extending between the main body and the pressing mechanism to compress the holding block disposed between the platform and the pressing mechanism;

positioning the selected optical component relative to the another optical component using the first portion of the positioning mechanism;

positioning the holding block relative to the selected optical component and in contact with the platform; and securing the selected optical component and the holding block, and the holding block and the platform, with the attachment component.

In accordance with a still further feature of the invention there is provided a method of precision alignment and assembly of opto-electronic components relative to one another, the method comprising:

providing apparatus for precision alignment and assembly of opto-electronic components relative to one another, the apparatus comprising:

a selected optical component having a periphery forming at least one flat surface;

a holding block having at least one attachment region corresponding to the at least one flat surface of the selected optical component;

a positioning mechanism having a first portion and a second portion, the first portion configured to position the selected optical component relative to another opto-electronic component, and the second portion configured to position the holding block relative to the selected optical component and in contact with a laser submount in attachment with the another opto-electronic component; and an attachment component disposed between the selected optical component and the holding block, and the attachment component disposed between the holding block and the laser submount so as to fix the selected optical component in position relative to the another opto-electonic component;

wherein the holding block comprises a substantially vertical attachment region configured to permit vertical adjustment of the holding block along the laser submount prior to fixation of the selected optical component thereon;

wherein the at least one attachment region of the holding block is substantially horizontal so as to permit attachment to a substantially horizontally disposed portion of the at least one flat surface of the selected optical component; and wherein the first portion of the positioning mechanism comprises a parallel gripper having a first end and a second end, the first end configured for releasably securing the selected optical component and the second end configured for attachment to an XYZ motion system, and the second portion of the positioning mechanism comprises a holding elevator configured for selectively positioning the holding block in a vertical direction while maintaining contact with the laser submount as contact is made between the at least one attachment region of the holding block and the at least one flat surface of the selected optical component;

positioning the selected optical component relative to the another optical component using the first portion of the positioning mechanism;

positioning the holding block relative to the selected optical component and in contact with the platform; and securing the selected optical component and the holding block, and the holding block and the platform, with the attachment component.

In accordance with a yet still further feature of the invention there is provided a method of precision alignment and assembly of opto-electronic components relative to one another, the method comprising:

providing apparatus for precision alignment and assembly of opto-electronic components relative to one another, the apparatus comprising:

a selected optical component having a periphery forming at least two flat surfaces;

a first holding block having at least one attachment region corresponding to a first one of the at least two flat surfaces of the selected optical component, and a second holding block having at least one attachment region corresponding to a second one of the at least two flat surfaces of the selected optical component;

a positioning mechanism having a first portion and a second portion, the first portion configured to position the selected optical component relative to another opto-electronic component, and the second portion configured to position the first holding block and the second holding block relative to the selected optical component and in contact with a platform in attachment with the another opto-electronic component; and an attachment component disposed between the selected optical component and the holding block, and the attachment component disposed between the holding block and the platform so as to fix the selected optical component in position relative to the another opto-electronic component;

wherein the second one of the at least two flat surfaces of the selected optical component is disposed in opposition to the first one so as to permit positioning of the holding block and the second holding block in parallel with one another; and wherein the first portion of the positioning mechanism comprises a pair of gripper arms having a first end and a second end, respectively, the first end configured for releasably securing the selected optical component and the second end configured for attachment to an XYZ motion system, and the second potion of the positioning mechanism comprises a pair of push rods selectively extending from the pair of gripper arms, respectively, further wherein the gripper arms and the XYZ motion system are configured to align the selected optical component with the another opto-electronic component, and the push rods are configured to push the first holding block and the second holding block against the platform, respectively;

positioning the selected optical component relative to the another optical component using the first portion of the positioning mechanism;

positioning the first holding block and the second holding block relative to the selected optical component and in contact with the platform, respectively; and securing the selected optical component with the holding block, and the first holding block and the second holding block with the platform, using the attachment component.

In accordance with a still further feature of the invention there is provided a method of precision alignment and assembly of opto-electronic components relative to one another, the method comprising:

providing apparatus for precision alignment and assembly of opto-electronic components relative to one another, the apparatus comprising:

a selected optical component having a periphery forming at least one flat surface;

a holding block having at least one attachment region corresponding to the at least one flat surface of the selected optical component;

a positioning mechanism having a first portion and a second portion, the first portion configured to position the selected optical component relative to another opto-electronic component, and the second portion configured to position the holding block relative to the selected optical component and in contact with a platform in attachment with the another opto-electronic component; and an attachment component disposed between the selected optical component and the holding block, and disposed between the holding block and the platform so as to fix the selected optical component in position relative to the another opto-electronic component;

wherein the holding block has a top surface and a bottom surface, and the top surface and the bottom surface are configured at a non-parallel angle with respect to one another;

wherein the at least one flat surface of the optical component is disposed at the non-parallel angle of the holding block when positioned by the first portion of the positioning mechanism so as to mate with the top surface of the holding block when the holding block is wedged between the platform; and wherein the first portion of the positioning mechanism comprises a first pair of gripping mechanisms having a first end and a second end, the first end configured for releasably securing the selected optical component and the second end configured for attachment to an XYZ motion system, and the second portion of the positioning mechanism comprises a second pair of gripping mechanisms configured to slide the holding block over the platform to the selected optical component so as to wedge the holding block between the platform and the selected optical component;

positioning the selected optical component relative to the another optical component using the first portion of the positioning mechanism;

positioning the holding block relative to the selected optical component and in contact with the platform; and securing the selected optical component and the holding block, and the holding block and the platform, with the attachment component.

The above and other features of the invention, including various novel details of construction and combinations of parts and method steps will now be more particularly described with reference to the accompanying drawings and pointed out in the claims. It will be understood that the particular devices and method steps embodying the invention are shown by way of illustration only and not as limitations of the invention. The principles and features of this invention may be employed in various and numerous embodiments without departing from the scope of the invention.

BRIEF DESCRIPTION OF THE DRAWINGS

These and other objects and features of the present invention will be more fully disclosed or rendered obvious by the following detailed description of the preferred embodiments of the invention, which are to be considered together with the accompanying drawings wherein like numbers refer to like parts, and further wherein.

DETAILED DESCRIPTION OF THE PREFERRED EMBODIMENTS

Referring to FIGS. 1–9, there are shown several attachment, alignment procedure, mechanical holding mechanism and gripping apparatus which are used to align and attach optical components such as optical lenses, optical fibers, optical beam splitters, optical reflectors, wavelength selective elements, and other optical elements to a common platform with sub-micrometer accuracy and high long term reliability and stability. These provide three dimensional (3-D) freedom of movement on a common platform for these elements. The novel apparatus and methods are described hereinbelow for the alignment and attachment of optical lenses made of glass. However, the methods and apparatus are configured to attach lenses made of other materials and other type of elements such as lenses with metal or plastic housing, optical fibers or any other optical element with a similar or corresponding geometry.

Figure 1:
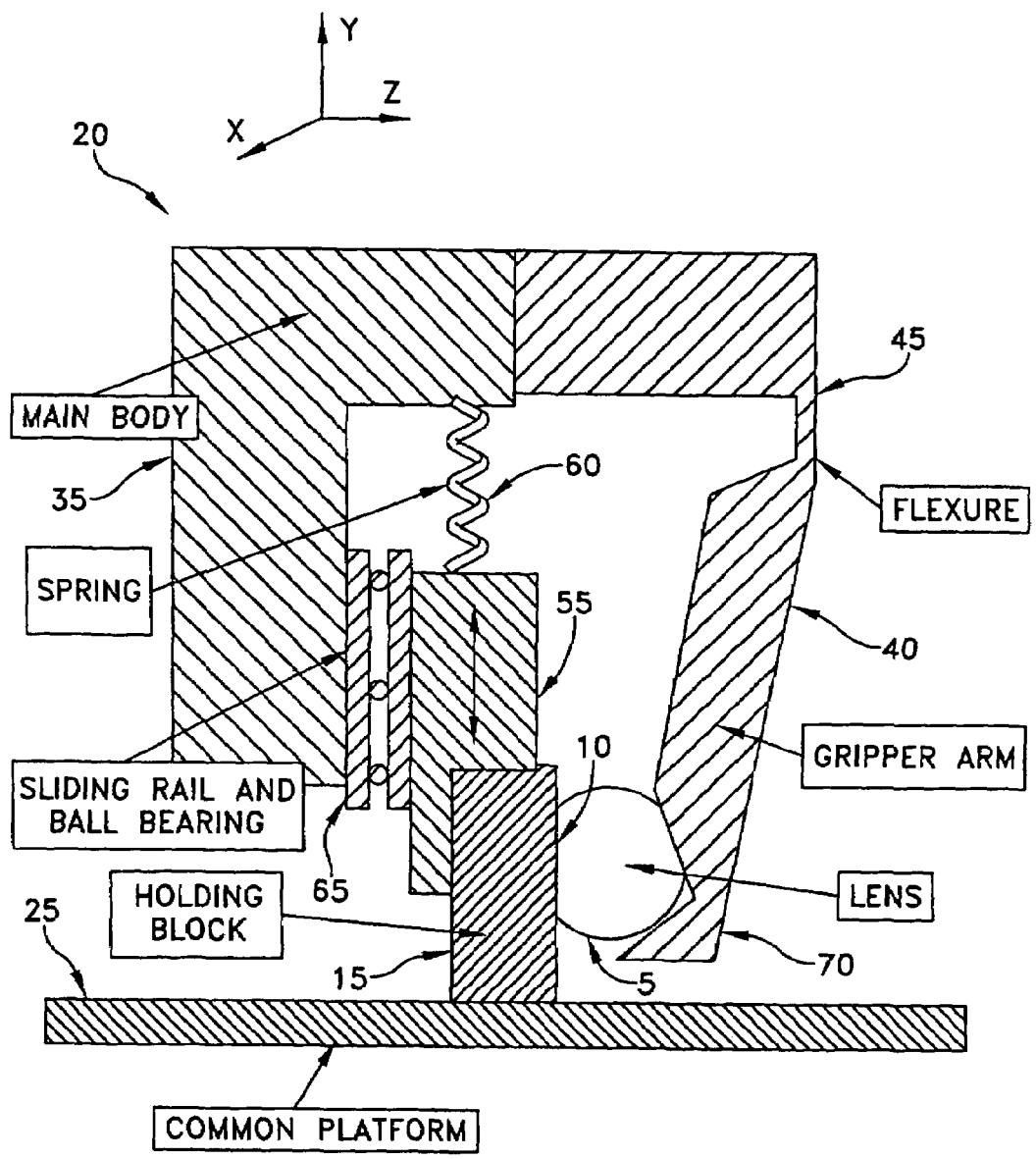
FIG. 1 is a schematic diagram of one form of a novel gripper mechanism configured for side-mount attachment of an optical component to a common platform, which is illustrative of a preferred embodiment of the invention.
Figure 2:
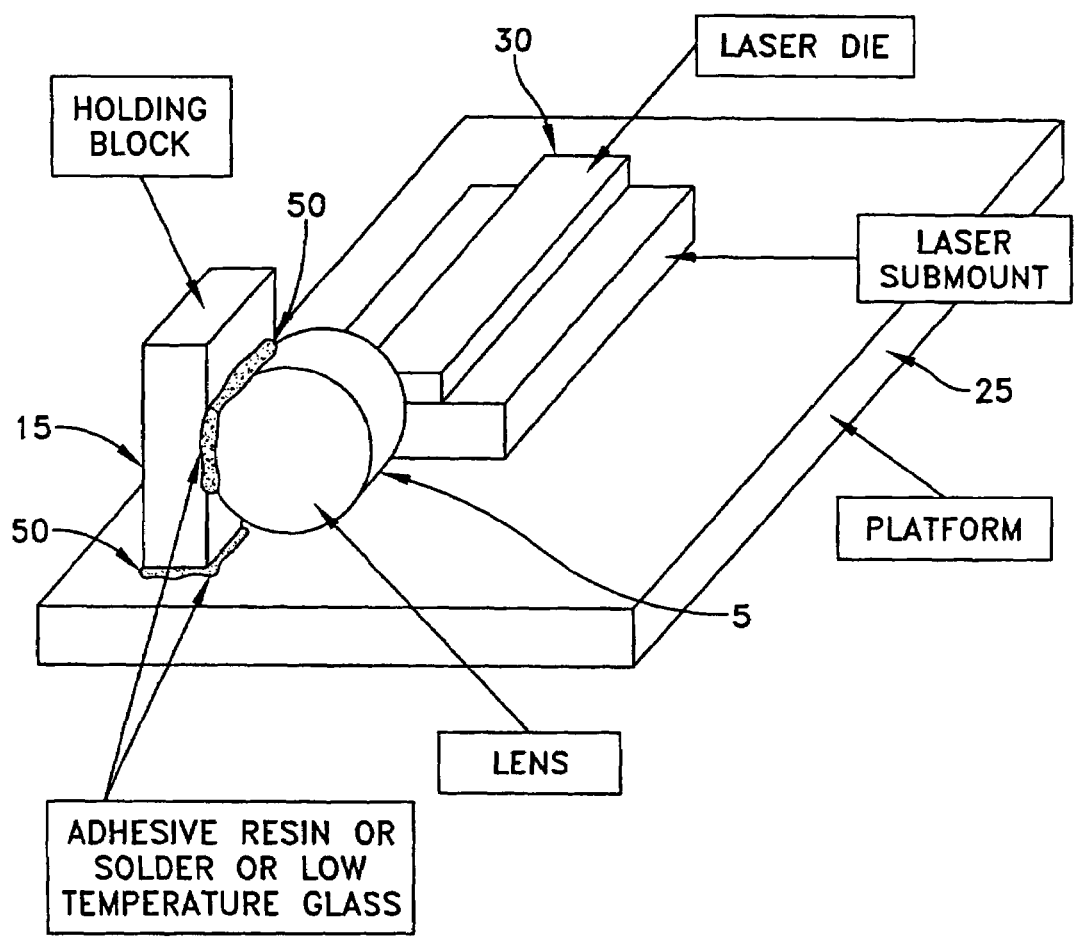
FIG. 2 is a schematic diagram of the optical component, holding block, and common platform shown aligned and assembled together by the novel gripper mechanism of FIG. 1.

Referring now to FIGS. 1 and 2, and in a preferred embodiment of the present invention, there is shown an optical lens 5 which has a flat side 10 on its periphery. A side-mount gripper mechanism 20 is used to selectively position lens 5 with respect to holding block 15, and is also used to selectively position both lens 5 and holding block 15 with respect to a common platform 25. A block of proper material 15, which here after is referred to as holding block 15 is configured for selective mating and attachment with lens 5. A gripper mechanism 20 is used to selectively position lens 5 with respect to holding block 15, and is also used to selectively position both lens 5 and holding block 15 with respect to a common platform 25. Using this gripper mechanism 20 optical element 5 is aligned and attached in front of a laser 30 or optical fiber (not shown) for collimation or focusing of the light. The attachment of holding block 15 to platform 25 and optical element 5 to holding block 15 can be achieved using an attachment component such as adhesives, solders, laser welding or low melting temperature glasses. For example, adhesives may include UV curable resins or thermally curable resins. The attachment process must be optimized to eliminate or minimize any possible shift of optical component 5 after alignment and attachment.

Optical element 5 such as lens 5 with flat side 10 on its periphery is pressed against a block of material 15 using gripper mechanism 20 while block 15 is in contact with common platform (FIG. 2). A main body 35 of gripper mechanism 20 is attached to a 3-D (XYZ) motion or translation system. Main body 35 is moved by this system in the three X,Y and Z directions independently. A gripper arm 40 is attached by a flexure 45 to main body 35 and is configured to press lens 5 against holding block 15. Between lens 5 and holding block 15 there is disposed an adhesive or solder 50. Holding block 15 is placed on common platform 25 and an attachment component 50, such as, adhesive or solder, is disposed between holding block 15 and common platform 25. Holding block 15 is pressed against common platform 25 using a pressing mechanism 55 together with a compression spring 60 and pressing mechanism 55 is attached to main body using a sliding rail system 65. Pressing mechanism 55 is therefore configured for movement only along Y axis, i.e. up and down, with respect to main body 35. Gripper mechanism 20 is configured to press holding block 15 downward in the Y direction against platform 25 and freely move in X and Z direction independent of the downward pressure in the Y direction. If the XYZ motion system is moved in X-Z plane then both holding block 15 and lens 5 are dragged and moved in X-Z plane, respectively. In addition, gripper mechanism 20 has a flexible finger mechanism 70 which is independent from the motion of holding block 15 and can move lens 5 along the Y direction (up and down) independent from the holding block which only can move in X-Z plane. This mechanism 70 enables positioning of optical element 5 (i.e., lens 5) with sub-micrometer accuracy in 3-D space while motion in each translation axis X, Y and Z are decoupled and independent from each other. Also, each of these three independent motions have been achieved only with one translation stage with three degrees of freedom. Using this gripper system 20 optical element 5 is attached in front of laser 30 for collimation of the light (FIG. 2). In addition, optical gripper system 20 may be used to attach optical elements in front of an optical fiber for focusing of light (not shown). The attachment of holding block 15 to platform 25 and optical element 5 to holding block 15 can be achieved using attachment component 50, such as adhesives, solders, laser welding or low melting temperature glasses. These adhesives may include, for example, ultraviolet curable resins or thermally curable resins. The attachment process is preferably optimized to eliminate or minimize any possible shift the optical component 5 after attachment to block 15 and release by gripper mechanism 20.

Front-Mount Attachment

Figure 3:
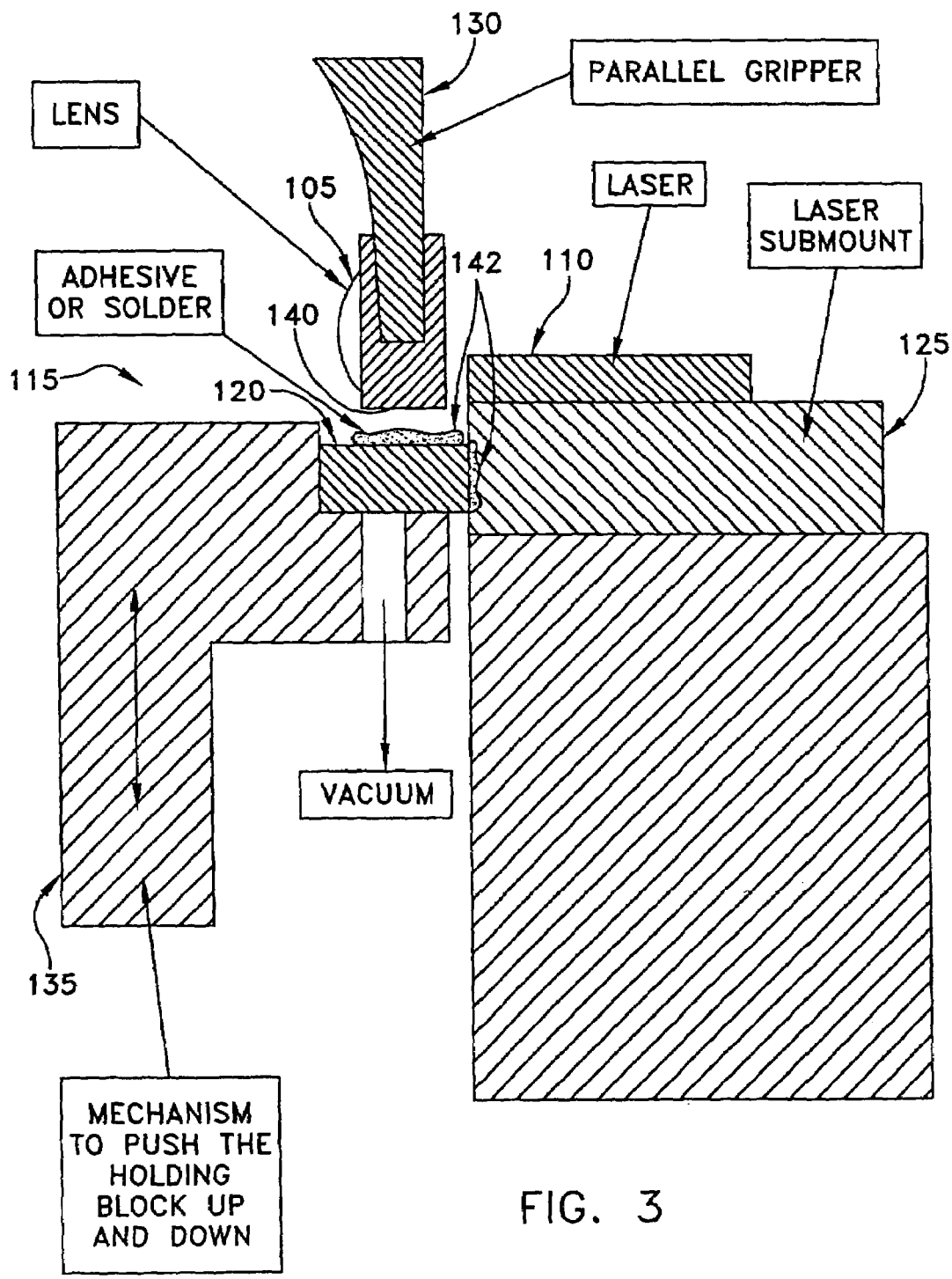
FIG. 3 is a schematic diagram of another formed of a novel gripper mechanism configured for front-mount attachment of optical components to a laser submount.
Figure 4:
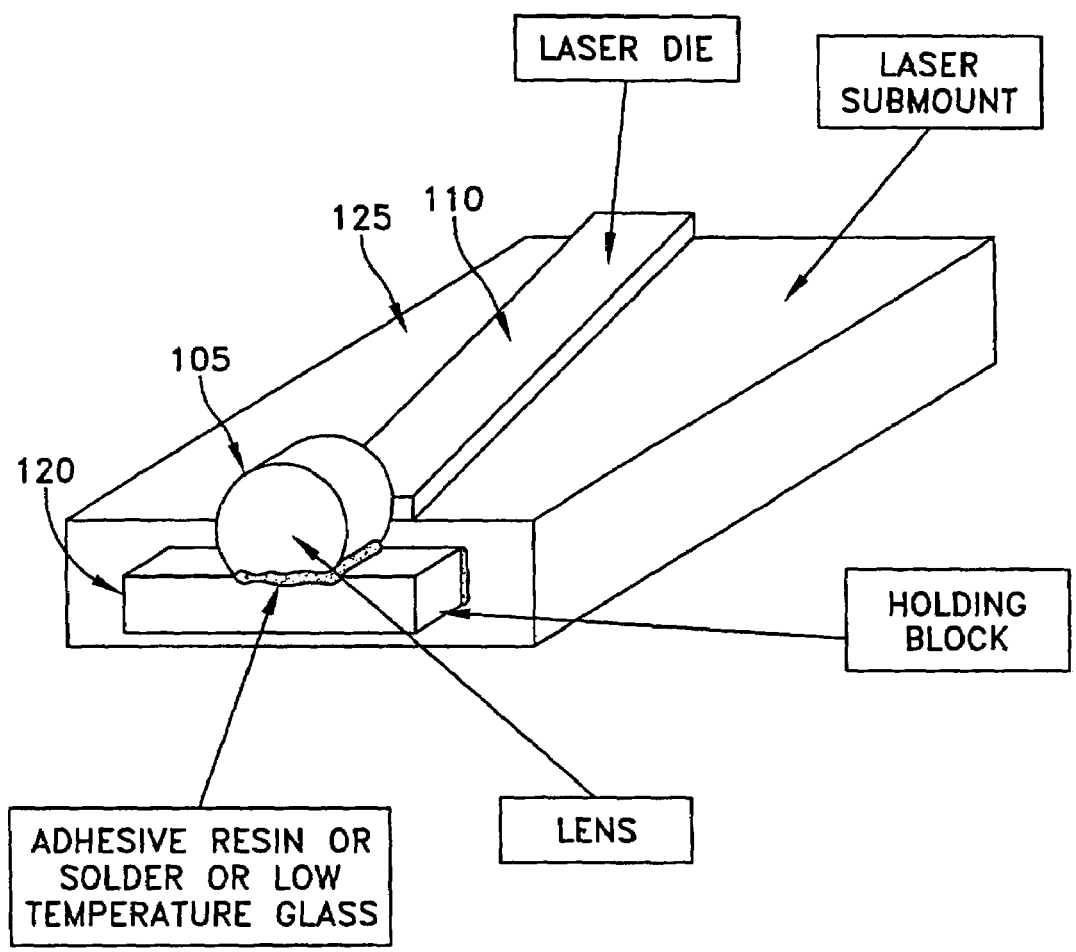
FIG. 4 is a schematic diagram of the optical component, holding block, and laser submount shown aligned and assembled together by the novel gripper mechanism of FIG. 3.

Referring now to FIGS. 3 and 4, there is shown an optical element 105, such as a lens 105, attached at the front of another optical element 110, such as a laser 110. A front-mount attachment mechanism 115 is configured to align lens 105 with laser 110 and then a holding block 120 to a laser submount 125, and attach lens 105 to holding block 120 attached to submount 125. Submount 125 of semiconductor laser chip 110 is used to attach holding block 120 which in turn holds lens 105 in front of laser chip 110 at a proper distance, height, and lateral position from the emission aperture of laser 110.

To align lens 105 with laser 110, attachment mechanism 115 uses a parallel gripping structure 130 which is preferably actuated pneumatically to hold lens 105 in front of laser 110. Gripper 130 is attached to an XYZ motion and translation stage which freely moves lens 105 in all three axes independently. In a first step of the process, lens 105 is free to move in X, Y, and Z direction and has no contact with holding block 120 from its flat side. Next, after lens 105 is aligned with laser 110, a holding block elevator 135 moves holding block 120 upward to contact lens 105 on a bottom portion 140 while pressing holding block 120 against laser sub-mount 125 with an attachment component 142 therebetween. Preferably, bottom portion 140 of lens 105 is flat so as to correspond to a flat upper portion of holding block 120. However, other complimentary configurations may be provided.

Once lens 105 is in contact with holding block 120, attachment component 142 between lens 105 and holding block 120 and submount 125 is cured and, as a result, holding block 120 is attached to laser submount 125 and lens 105 is attached to holding block 120 at a proper distance and position from laser emission facet (not shown). To achieve this arrangement attachment component 142 may include adhesive, solder, laser welding, or low melting temperature glass for attachment of lens 105, holding block 120 and laser sub-mount 125.

Sandwich-Mount Attachment

Figure 5:
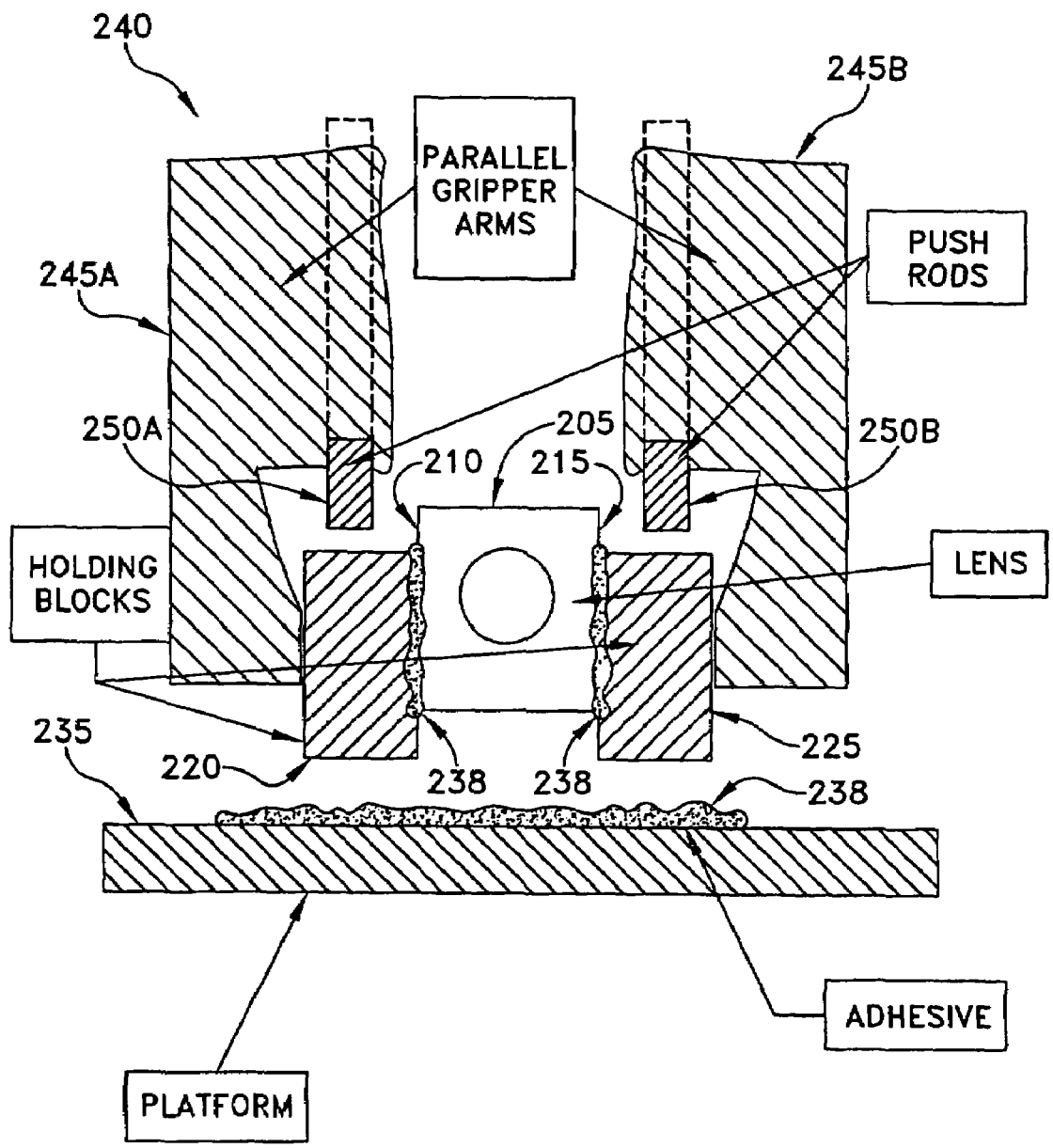
FIG. 5 is a schematic diagram of a preferred embodiment of the present invention in which there is shown a novel gripper mechanism configured for sandwich-mount attachment of an optical component to a common platform.
Figure 6:
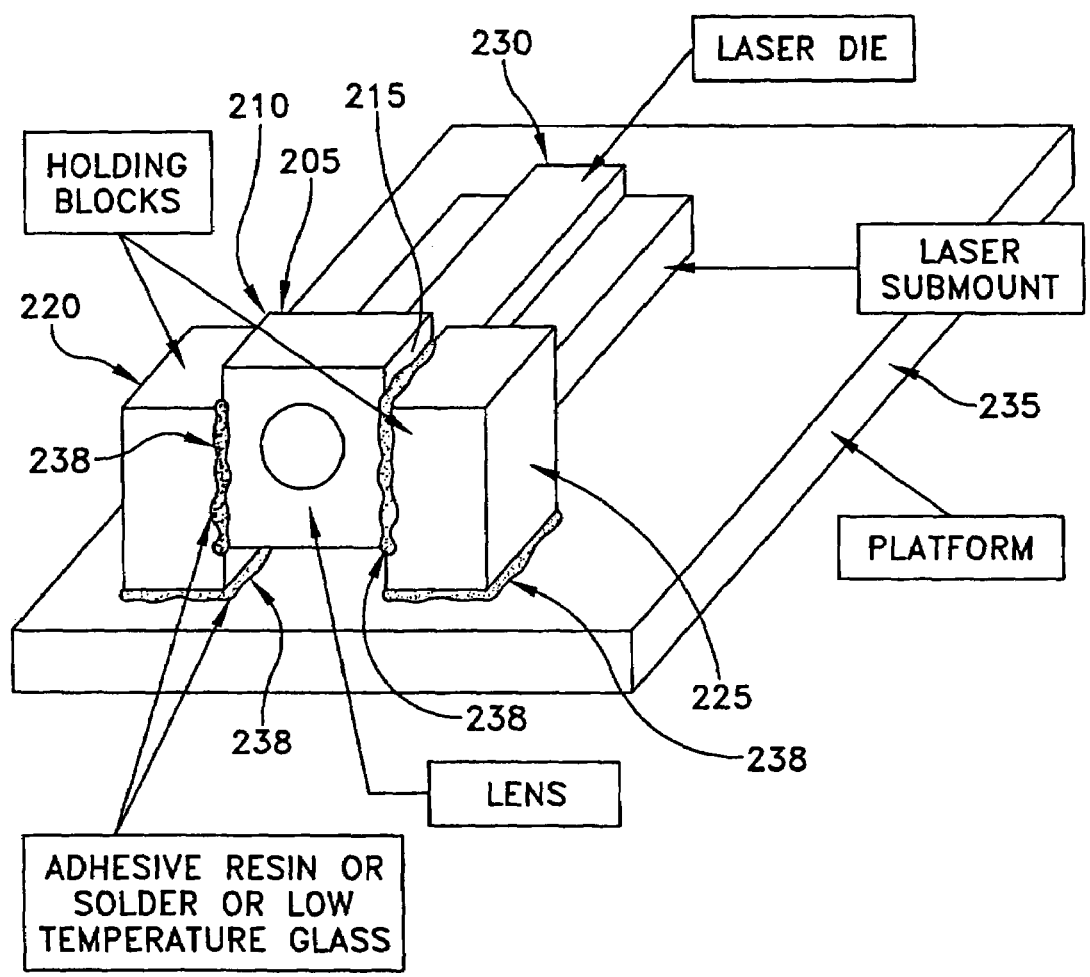
FIG. 6 is a schematic diagram of the optical component, holding blocks, and common platform as aligned and assembled together by the novel gripper mechanism of FIG. 5.

Referring now to FIGS. 5 and 6, there is shown an optical glass lens 205 which has two flat sides 210, 215 on its periphery. Optical glass lens 205 is mated and attached to two blocks of proper material 220, 225 which here after are called holding blocks 220, 225. Optical element 205 is attached in front of a laser 230 for collimation of light (FIG. 6). Alternatively, an optical element may be attached in front of an optical fiber for focusing of light (not shown). The attachment of holding blocks 220, 225 to a platform 235 and optical element 205 to holding blocks 220, 225 can be achieved using an attachment component 238 such as, for example, an adhesive, solders, laser welding or low melting temperature glasses. The adhesives may include, but are not limited to, ultraviolet curable resins or thermally curable resins. To achieve this arrangement, a sandwich mount gripper mechanism 240 with parallel gripper arms 245A, 245B configured to press two flat sides 210, 215 of lens 205 against two blocks 220, 225 while blocks 220, 225 are not in contact with common platform 235. A main body (not shown) of gripper structure 240 is attached to a 3-D (XYZ) motion or translation system (not shown) which moves main body of gripper mechanism in three X,Y and Z directions independently. Gripper arms 245A, 245B are actuated pneumatically and contain two small push rods 250A, 250B which are also actuated pneumatically.

In first step of the process, lens 205 is aligned at proper position with respect to the facet of laser 230 and then two push rods 250A, 250B are activated and as a result these push rods 250A, 250B exert force on two holding blocks 220, 225 so as to push these blocks 220, 225 down against platform 235. Once the contact between holding blocks 220, 225 and platform 235 is achieved, adhesives 238 are cured and parallel gripper arms 245A, 245B are opened and lens is released therefrom.

Wedge Attachment

Figure 7:
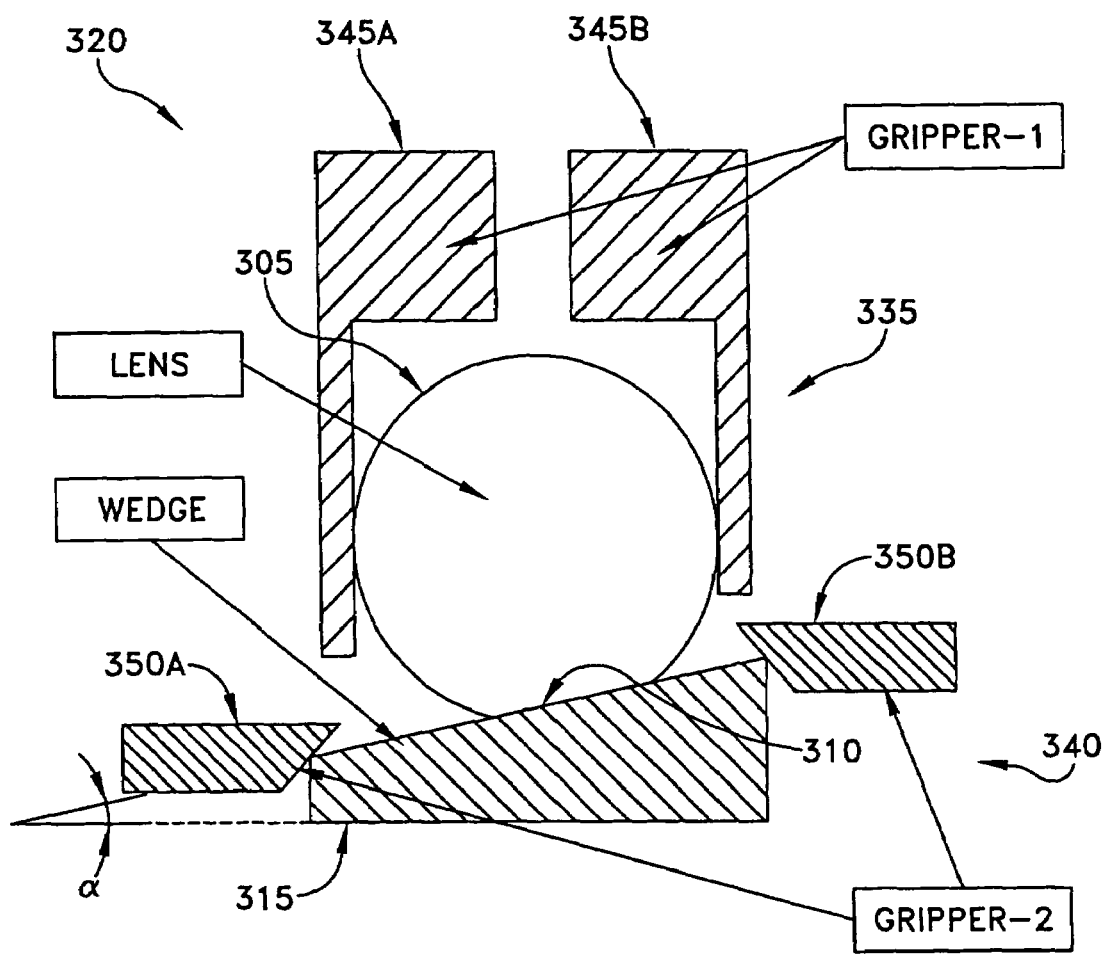
FIG. 7 is a schematic diagram of a preferred embodiment of the present invention in which there is shown a novel system of a wedge attachment block and two pairs of grippers configured for attachment of an optical component to a common platform in optical alignment with another optical component.
Figure 8:
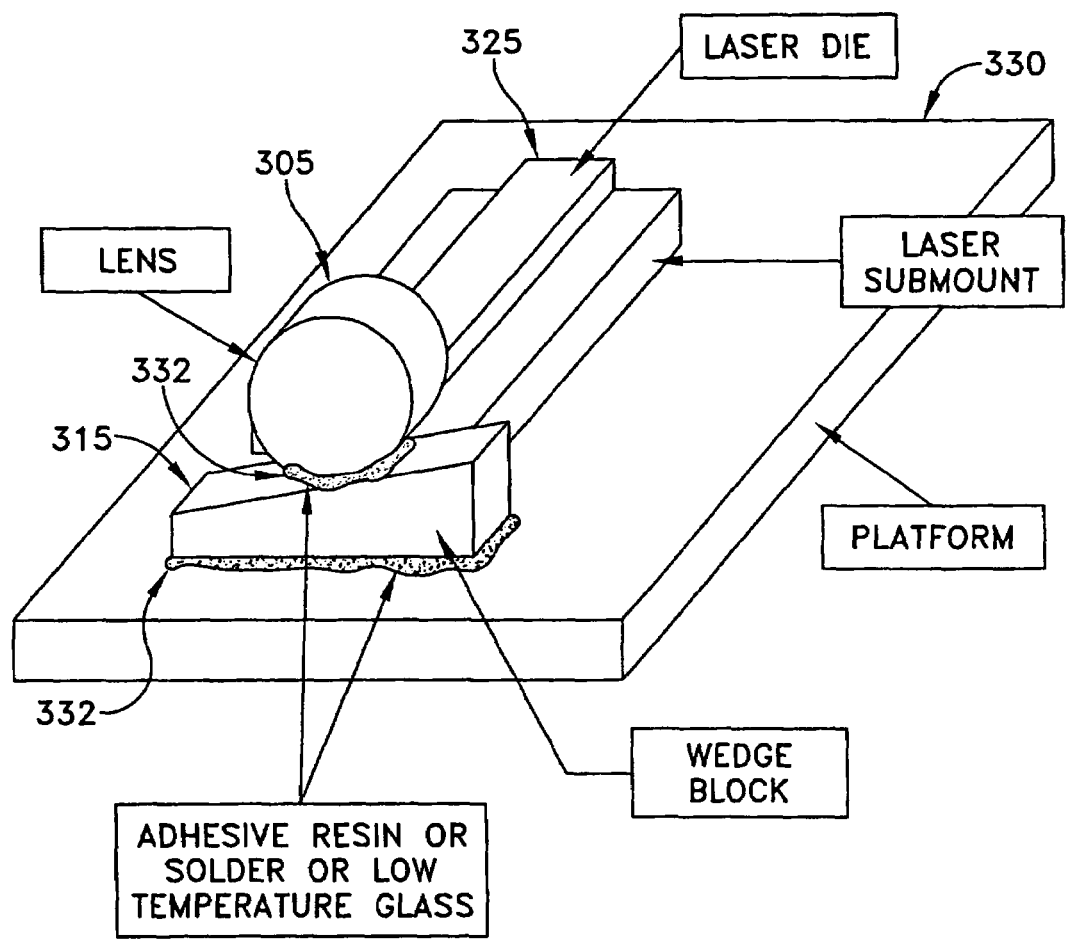
FIG. 8 is a schematic diagram of the optical component, wedge holding block, and common platform as aligned and assembled together by the two pairs of grippers shown in FIG. 7.

Referring now to FIGS. 7 and 8, there is shown an optical glass lens 305 which has one flat side 310 on its periphery and is configured to mate and attach to a block of material 315 which has a small wedge angle α. A wedge alignment system 320 is provided to attach lens 305 or other optical elements in front of a laser 325 (FIG. 8) for collimation of light. Additionally, wedge alignment system 320 may be used to attach optical components in front of an optical fiber for focusing of light (not shown). The attachment of wedge block 315 to a platform 330 and optical element 305 to wedge block 315 can be achieved using an attaching component 332 such as adhesives, solders, laser welding or low melting temperature glasses. Adhesives may include ultraviolet curable resins or thermally curable resins.

To achieve this arrangement, a pair of gripper mechanisms 335, 340 are used to hold and manipulate the position of wedge 315 and lens 305 relative to each other. First gripper mechanism 335 has a pair of parallel gripper mechanisms 345A, 345B, which can hold and move lens 305 in X-Y-Z directions independent from the second gripper mechanism 340. Second gripper mechanism 340 has a simple holding structure 350A, 350B, which is capable of freely sliding wedge 315 over surface of optical platform 330, while pushing wedge 315 down against platform 330.

Initially, wedge 315 is completely moved away from lens 305 such that lens 305 is moved and aligned freely in 3D space. Once lens 305 is properly aligned with laser 325 edge block is pushed under lens 305 such that it comes in contact with lens 305. At this time, attaching component 332 is activated and bonding is completed.

Single-Mode Fiber Attachment

Coupling of light from a light source to a single mode optical fiber is a difficult process which requires sub-micron positioning accuracy of optical components such as, for example, lenses between the light source and fiber. Further difficulty arises when the position of these optical components is incorrect relative to a fiber and a light source and must be corrected after attachment. Since known attachment processes for aligning and fixing these elements relative to one another is not perfect, a post attachment shift is typically inherent. At visible wavelengths, the core of single mode optical fiber is about 3–4 micron and post attachment shifts have more adverse effect on final coupling efficiency between the source and the fiber. An optical design method is provided hereinbelow which reduces the sensitivity of the coupling efficiency to misalignment of optical elements between the fiber and the light source.

Figure 9:
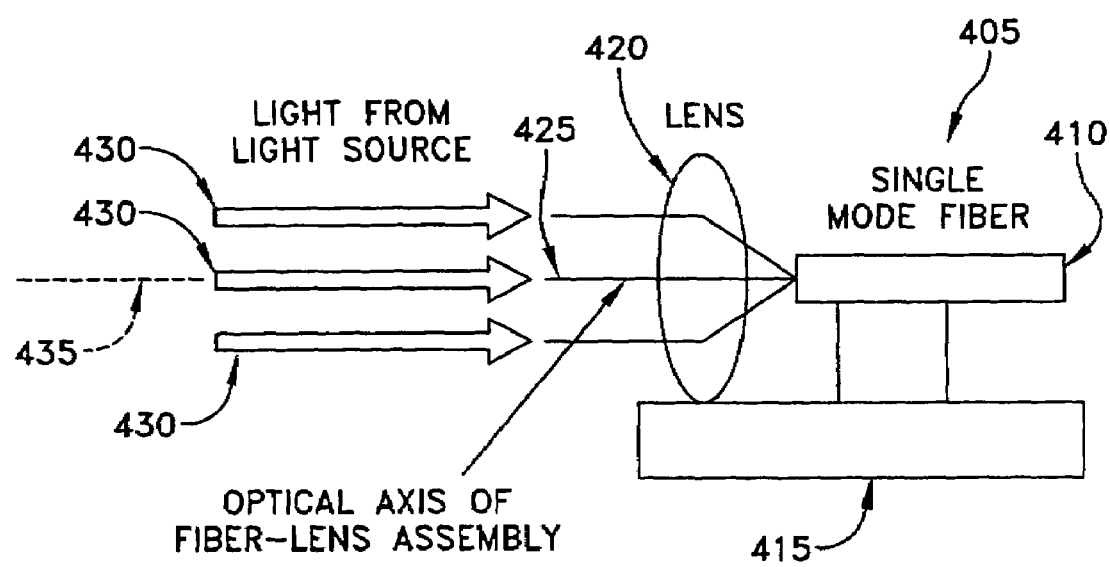
FIG. 9 is a schematic diagram of a novel assembly of a single mode fiber and lens configured in attachment to one another for coupling of light into the fiber.

Referring now to FIG. 9, there is shown a fiber-lens assembly 405 having a single mode fiber 410 mounted to a platform 415 and a lens 420 mounted to platform 415 so as to provide an optical axis 425 which is in alignment for lens 420 and fiber 410.

In this arrangement in which a collimated or semi-collimated beam of light 430 is incident on lens 420 and is then focused on the core of single mode optical fiber 410. The relative position of fiber 410 and lens 420 can be fixed with respect to one another such that lens 420 and fiber 410 can be moved together as assembly 405 and aligned relative to incident light beam 430. In order to maximize coupling of light 430 into fiber 410 the conditions should be satisfied: (1) optical axis 425 of fiber-lens assembly 405 and optical axis 435 of incident beam 430 should be collinear and coaxial; (2) the relative position of lens 420 to fiber 410 in fiber-lens assembly is configured such that divergence angle of the incident beam 430 is the same as optical divergence angle of fiber-lens assembly 405. Optical divergence of the fiber-lens assembly 405 is defined by coupling light into fiber 410, from other end opposite of lens 420, and then measuring the divergence of the light exiting lens in the reverse direction relative to incident beam 430; and (3) the relative position of lens 420 to fiber in fiber-lens assembly 405 is configured such that diameter of the incident beam 430 be the same as beam diameter of fiber-lens assembly 405. Beam diameter of fiber-lens assembly 405 is defined by coupling light into fiber 410, from other end opposite of lens 420, and then measuring the beam diameter of the light exiting lens 420 in the reverse direction relative to incident beam 430.

From the above-identified conditions it is noted that (1) lateral misalignment of incident beam 430 relative to fiber-lens assembly 405 is less important as the diameter of beam 430 increases, which is referred to as non-coaxial misalignment, and (2) angular misalignment of incident beam 430 and fiber-less assembly 405 is less important as the divergence angle of beam 430 increases.

Due to nature of Gaussian beam optics, which is a good approximation for optical mode of single mode fibers, optical beam diameter and divergence angle are inversely proportional. A beam with larger diameter has smaller divergence angle. Thus, in order to minimize the misalignment effect on coupling efficiency of light 430 into fiber 410, an optimal beam diameter, or optimal divergence angle is selected, such that both above conditions can be satisfied. As one example, a single mode fibers in visible wavelengths with a core diameter of 3–5 microns and a beam diameter between 390–450 microns is an optimal beam diameter and provides minimum dependence of coupling efficiency on lateral and angular misalignment.

What is claimed is:

1. Apparatus for precision alignment and assembly of opto-electronic components relative to one another, the apparatus comprising:
a selected optical component having a periphery forming at least one flat surface;
a holding block having at least one attachment region corresponding to the at least one flat surface of the selected optical component;
a positioning mechanism having a first portion and a second portion, the first portion configured to position the selected optical component relative to another opto-electronic component, and the second portion configured to position the holding block relative to the selected optical component and in contact with a platform in attachment with the another opto-electronic component;
an attachment component disposed between the selected optical component and the holding block, and the attachment component disposed between the holding block and the platform so as to fix the selected optical component in position relative to the another opto-electronic component; and
wherein the first portion of the positioning mechanism comprises a flexible finger mechanism, wherein the second portion of the positioning mechanism comprises a pressing mechanism, and wherein the positioning mechanism comprises a main body configured for attachment to an XYZ motion system, a gripper arm having a first end and a second end, the first end of the gripper arm connected by a flexure to the main body, the second end of the gripper arm connected to the flexible finger mechanism, and the pressing mechanism comprises a sliding rail system and a spring, a first portion of the sliding rail system mounted vertically to the main body, a second portion of the sliding rail system mounted vertically to the pressing mechanism, and bearings between the first portion and the second portion configured to simultaneously allow vertical motion, and restrict horizontal motion, of the pressing mechanism with respect to the main body, and the spring extending between the main body and the pressing mechanism to urge the holding block toward the platform.

2. Apparatus for precision alignment and assembly of opto-electronic components relative to one another, the apparatus comprising:
a selected optical component having a periphery forming at least one flat surface;
a holding block having at least one attachment region corresponding to the at least one flat surface of the selected optical component;
a positioning mechanism having a flexible finger mechanism and a pressing mechanism, the flexible finger portion configured to position the selected optical component relative to another opto-electronic component, and the pressing mechanism configured to position the holding block relative to the selected optical component and in contact with a platform in attachment with the another opto-electronic component; and an attachment component disposed between the selected optical component and the holding block, and the attachment component disposed between the holding block and the platform so as to fix the selected optical component in position relative to the another opto-electronic component;

wherein the at least one attachment region of the holding block is substantially vertical so as to permit vertical adjustment of the selected optical component with respect to the platform;

wherein the holding block comprises a substantially horizontal attachment region configured to permit horizontal adjustment of the selected optical component with respect to the platform prior to fixation of the holding block to the platform; and wherein the positioning mechanism comprises a main body configured for attachment to an XYZ motion system, a gripper arm having a first end and a second end, the first end of the gripper arm connected by a flexure to the main body, the second end of the gripper arm connected to the flexible finger mechanism, and the pressing mechanism comprises a sliding rail system and, a spring, a first portion of the sliding rail system mounted vertically to the main body, a second portion of the sliding rail system mounted vertically to the pressing mechanism, and bearings between the first portion and the second portion to allow vertical motion, and restrict horizontal motion, of the pressing mechanism with respect to the main body, and the spring extending between the main body and the pressing mechanism to compress the holding block disposed between the platform and the pressing mechanism.

3. A method of precision alignment and assembly of opto-electronic components relative to one another, the method comprising:

providing an apparatus for precision alignment and assembly of opto-electronic components relative to one another, the apparatus comprising:

a selected optical component having a periphery forming at least one flat surface;

a holding block having at least one attachment region corresponding to the at least one flat surface of the selected optical component;

a positioning mechanism having a flexible finger mechanism and a pressing mechanism, the flexible finger portion configured to position the selected optical component relative to another opto-electronic component, and the pressing mechanism configured to position the holding block relative to the selected optical component and in contact with a platform in attachment with the another opto-electronic component; and an attachment component disposed between the selected optical component and the holding block, and the attachment component disposed between the holding block and the platform so as to fix the selected optical component in position relative to the another opto-electronic component;

wherein the at least one attachment region of the holding block is substantially vertical so as to permit vertical adjustment of the selected optical component with respect to the platform;

wherein the holding block comprises a substantially horizontal attachment region configured to permit horizontal adjustment of the selected optical component with respect to the platform prior to fixation of the holding block to the platform; and wherein the positioning mechanism comprises a main body configured for attachment to an XYZ motion system, a gripper arm having a first end and a second end, the first end of the gripper arm connected by flexure to the main body, the second end of the gripper arm connected to the flexible finger mechanism, and the pressing mechanism comprises a sliding rail system and a spring, a first portion of the sliding rail system mounted vertically to the main body, a second portion of the sliding rail system mounted vertically to the pressing mechanism, and bearings between the first portion and the second portion to allow vertical motion, and restrict horizontal motion, of the pressing mechanism with respect to the main body, and the spring extending between the main body and the pressing mechanism to compress the holding block disposed between the platform and the pressing mechanism;

positioning the selected optical component relative to the another optical component using the first portion of the positioning mechanism;

positioning the holding block relative to the selected optical component and in contact with the platform; and securing the selected optical component and the holding block, and the holding block and the platform, with the attachment component.

4. A method according to claim 3 wherein the steps of positioning the selected optical component and positioning the holding block occur simultaneously with one another.

5. A method according to claim 3 wherein the steps of positioning the selected optical component and positioning the holding block repeatedly occur prior to the step of securing the selected optical component and the holding block, and the holding block and the platform, with the attachment component.

* * * * *